:::
(12) United States Patent
Ma

(10) Patent No.: US 8,860,487 B2
(45) Date of Patent: Oct. 14, 2014

(54) SYSTEM AND METHOD FOR A LEVEL SHIFTER

(71) Applicant: Infineon Technologies Austria AG, Villach (AT)

(72) Inventor: Fan Yung Ma, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/688,702

(22) Filed: Nov. 29, 2012

(65) Prior Publication Data

US 2014/0145777 A1 May 29, 2014

(51) Int. Cl.
*H03L 5/00* (2006.01)

(52) U.S. Cl.
USPC .................................. 327/333; 326/80; 326/81

(58) Field of Classification Search
USPC ....................................... 327/333; 326/80, 81
See application file for complete search history.

(56) References Cited

U.S. PATENT DOCUMENTS 7,605,609 B1 * 10/2009 Andrews et al. ................ 326/68

OTHER PUBLICATIONS

Lim, Ji-Hoon et al., "A Novel High-Speed and Low-Voltage CMOS Level-Up/Down Shifter Design for Multiple-Power and Multiple-Clock Domain Chips," IEICE Trans. Electron., vol. E90-C, No. 3, Mar. 2007, 5 pages.
Otsuka, Nobuaki et al., "Circuit Techniques for I.5-V Power Supply Flash Memory," IEEE Journal of Solid-State Circuits, vol. 32, No. 8, Aug. 1997, 14 pages.
Tran, Canh Q., et al., "Low-Power High-Speed Level Shifter Design for Block-Level Dynamic Voltage Scaling Environment," IEEE International Conference on Integrated Circuit and Technology, May 9-11, 2005, 4 pages.

* cited by examiner

*Primary Examiner* — Kenneth B. Wells
(74) *Attorney, Agent, or Firm* — Slater & Matsil, L.L.P.

(57) ABSTRACT

In accordance with an embodiment, a level shifter circuit includes a reconfigurable level shifting core coupled to a first node and a second node. The reconfigurable level shifting core is configured as a current mirror in a first mode, and as a cross-coupled device in a second mode. In the first mode, the current mirror mirrors a current at the first node to the second node, and in the second mode, the cross-coupled device produces a current at the second node in response to a voltage at the first node, and a current at the first node in response to a voltage at the second node.

22 Claims, 9 Drawing Sheets

SYSTEM AND METHOD FOR A LEVEL SHIFTER

TECHNICAL FIELD

This invention relates generally to semiconductor circuits and methods, and more particularly to a system and a method for a level shifter.

BACKGROUND

A system-on-a chip (SoC) may contain core circuits that operate at a lower supply voltage than interface circuits used to drive off-chip circuits. For example, core circuits may operate at a power supply voltage of 1 V in order to take advantage of space efficient transistors that are implemented using state of the art fine geometry processes. On the other hand, interface circuits may operate at a power supply voltage of 3.3 V or higher in order to comply with interface requirements of off chip circuits. Consequently, these interface circuits may use less space efficient transistors that are capable of operating at higher voltages. By partitioning core circuits and interface circuits to use different device geometries in different voltage domains, the size and power consumption of an integrated circuit can be optimized.

In order to provide an interface between low and high voltage domains, the SoC may use level shifting circuits to transfer data between these domains. For example, a low-to-high level shifter may be used to propagate a digital signal between a low voltage domain and a high voltage domain, and are commonly implemented using cross-coupled positive feedback circuits. Such level shifters that use high voltage devices, however, may dissipate higher transient power consumption and propagation delay than regular logic devices. Furthermore, the performance of level shifting circuits, including speed and power consumption may vary over process, temperature, and power supply voltage. In some cases, this propagation delay and power consumption may be a limiting performance factor in a SoC.

SUMMARY OF THE INVENTION

In accordance with an embodiment, a level shifter circuit includes a reconfigurable level shifting core coupled to a first node and a second node. The reconfigurable level shifting core is configured as a current mirror in a first mode, and as a cross-coupled device in a second mode. In the first mode, the current mirror mirrors a current at the first node to the second node, and in the second mode, the cross-coupled device produces a current at the second node in response to a voltage at the first node, and a current at the first node in response to a voltage at the second node.

In accordance with a further embodiment, a level shifter includes a cross-coupled transistor pair having a first internal node coupled to an output node of a first transistor and a control node of a second transistor, and a second internal node coupled to an output node of the second transistor and a control node of the first transistor. The level shifter further includes a first pass transistor coupled between a first input node and the first internal node, a second pass transistor coupled between a second input node and the second internal node, and a low voltage control stage having a first output coupled to the first input node, and a second output coupled to the second input node.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a level shifter used to propagate a digital logic signal from a first voltage domain to a higher voltage domain. The invention may be applied, however, to other types of circuits and systems, for example, which are used to propagate signals between power supply domains of arbitrary voltages and performance levels. For example, embodiments of the inventions may be applied to interface signals between a quiet or sensitive power supply domain and a noisy power supply domain, between analog and digital supply domains, between positive supply voltage and negative supply voltage domains, and/or between on-chip and off-chip power supply domains. Embodiments may also be applied to level shifters that propagate signals between low to high voltage domains or vice-versa depending on the application context.

In an embodiment, a common gate stage is used to isolate a low voltage control stage from a cross-coupled pair of level shifting transistors. By isolating the cross-coupled pair of level shifting transistors from the control stage, the pull down drive of the level shifter may be increased and contention within the cross-coupled pair of level shifting transistors may be reduced.

In a further embodiment, a reconfigurable level shifting core circuit is used to increase the pull up speed of a level shifting circuit. In a first mode of operation, the reconfigurable level shifting core is configured as a current mirror. This first mode of operation is active when the output of the level shifter is pulling up. In a second mode of operation, when the level shifter output is being pulled down, the reconfigurable level shifting core circuit is configured to operate as a cross-coupled pair of level shifting transistors.

Figure 1:
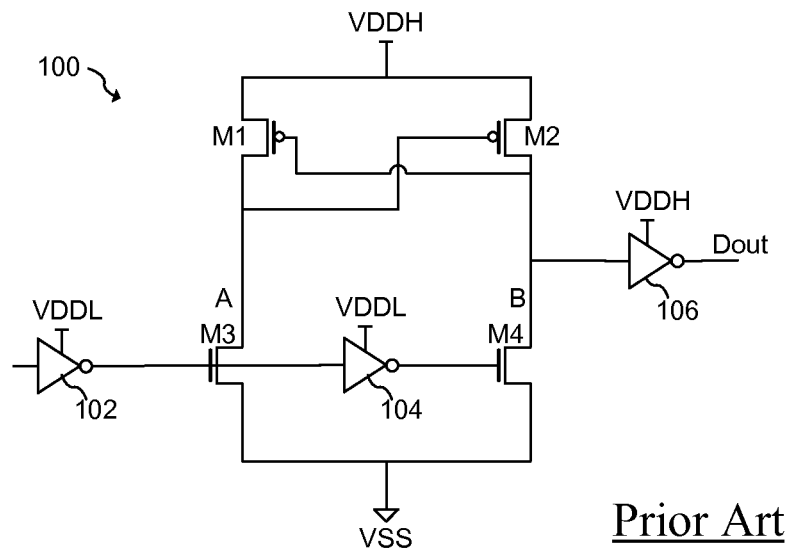
FIG. 1 illustrates a level shifter according to the prior art.

FIG. 1 illustrates a typical level shifting circuit 100 that contains an input stage made of NMOS transistors M3 driven by inverter 102, and NMOS transistor M4 driven by inverter 104. Both inverters 102 and 104 are reference to low voltage power supply VDDL. The drains of transistors M3 and M4 are loaded by a cross-coupled pair of PMOS transistors M1 and M2, respectively at nodes A and B. The output of the cross-coupled pair of PMOS transistors is coupled to inverter 106. High-voltage power supply VDDH is coupled to the cross-coupled pair of PMOS transistors as well as to inverter 106.

During operation, when the input signal Din experiences a low to high transition, the output of inverter 102 experiences a high to low transition, thereby transitioning transistor M3 from an on state to an off state. Also, the output of inverter 104 experiences a low to high transition, thereby turning transistor M4 from an off state to an on state. As transistor M4 turns on, the voltage at node B is pulled down from VDDH to VSS. VSS may be ground potential (i.e. zero volts), some other potential close to ground potential or another reference potential lower than VDDL and VDDH. In some cases, VSS may represent a negative voltage supply. As the difference between supply voltage VDDH and the voltage of node B exceeds the turn on threshold of transistor M1, transistor M1 pulls node A to VDDH. Before transistor M1 charges node A, there is contention between M4 (pull-down) and M2 (pull-up). Therefore, in order to turn-off transistor M2, transistor M4 needs to generate enough current to sink current generated by transistor M2, as well as provide enough additional current to discharge node B. This extra crowbar current and contention between devices causes increased power consumption and propagation delay.

Likewise, when input signal Din experiences a high to low transition, the output of inverter 102 experiences a low to high transition, thereby transitioning transistor M3 from an off state to an on state, and the output of inverter 104 experiences a high to low transition, thereby transitioning transistor M4 from an on state to an off state. As transistor M3 turns on, the voltage at node A is pulled down from VDDH to VSS. As the difference between supply voltage VDDH and the voltage of node A exceeds the turn on threshold of transistor M2, transistor M2 pulls node B to VDDH. It can be seen that there may be an appreciable signal delay when input signal Din experiences a high to low transition, since node A needs to discharge and turn on transistor M2 before node B is pulled up and the output of inverter changes state. Similar to the case of when Din experiences a low to high transition, before transistor M2 charges node B, there is contention between M3 (pull-down) and M1 (pull-up). Consequently, transistor M3 needs to sink the current output by transistor M1, as well as provide enough additional current to discharge node A. Again, this crowbar current and contention between devices causes increased power consumption and propagation delay.

Delay and current consumption may be further exacerbated if VDDH exceeds the safe operating range for low voltage devices, and high voltage devices are used for NMOS device M3 and M4, and PMOS devices M1 and M2 respectively. In order to withstand higher voltages, such higher voltage devices are implemented using larger geometries, thicker gate oxides, and larger minimum gate lengths. As such, high voltage devices have a lower drive strength and may exhibit higher parasitic capacitances in some cases. Since these devices are slower, additional propagation delay may be introduced, and the devices in level shifter 100 may remain in a state of contention for a longer period of time during a state transition. Furthermore, the performance of level shifter 100 may be subject to variation over process, temperature and supply voltage.

Figure 2A:
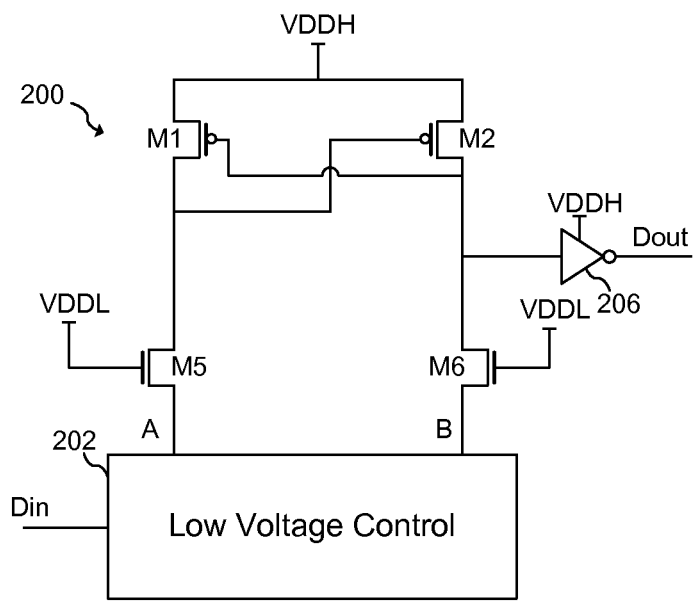
FIGS. 2a-f illustrate level shifters employing embodiment low voltage control circuits.

FIG. 2a illustrates level shifter 200 according to an embodiment of the present invention. Here, common gate NMOS devices M5 and M6 along with low voltage control block 202 are used to increase the pull-down driver strength and mitigate the contention of level shifter 200. By implementing low voltage control block 202 using low voltage devices, a higher signal strength per unit area may be achieved in comparison to using high voltage devices. As shown, low-voltage control block 202 interfaces with nodes A and B that are coupled to the sources of common gate transistors M5 and M6, respectively. Inverter 206 coupled to the drain of PMOS transistor M2 buffers the output of level shifter 200 to output signal Dout. Inverter 206 is referenced to high-voltage supply VDDH.

Common gate devices M5 and M6 isolate the high voltage domain of PMOS transistors M1 and M2 from low voltage control block 202, thereby protecting low voltage devices in low voltage control block 202 from breakdown and/or damage. In some embodiments, common gate devices M5 and M6 may be implemented using high voltage devices. Alternatively, common gate devices M5 and M6 may also be implemented using low voltage devices, for example, in situations where VDDH is low enough such that common gate devices M5 and M6 may operate safely. Such a condition may exist when VDDH is less than twice VDDL. While common gate devices M5 and M6 are shown with their gates biased to low voltage supply VDDL, in alternative embodiments, other suitable bias voltages may be used depending on the particular application and its specifications.

Figure 2B:
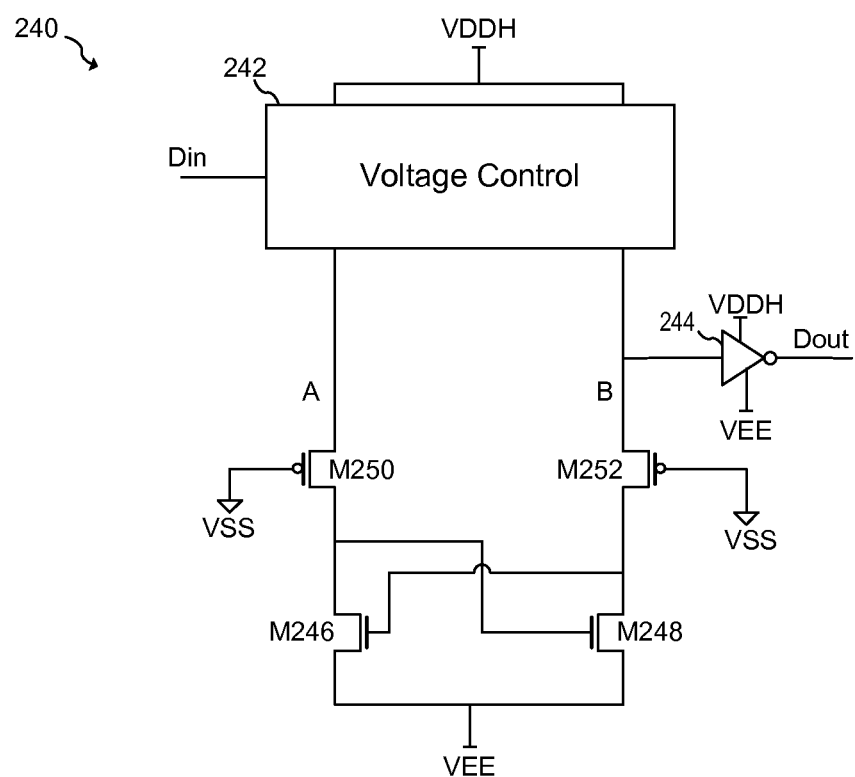

While cross-coupled devices M1 and M2 are illustrated as being implemented as PMOS devices, and common gate devices M5 and M6 are shown being implemented as NMOS devices, it should be appreciated that these transistors may be implemented using different device types in alternative embodiments. For example, transistors M1 and M2 may be implemented using NMOS devices and common gate devices M5 and M6 may be implemented using PMOS devices. Such an embodiment may be used, for example, in level shifter 240 having a high voltage domain referenced to a negative voltage as shown in FIG. 2b. Here, negative voltage VEE is coupled to cross-coupled NMOS devices M 246 and M248, which are further coupled to common gate PMOS devices M250 and M252 having gates biased at VSS or some other suitable bias voltage between VDDH and VEE. Voltage control block 242 provides control currents to nodes A and B based on the signal level of logic signal Din that has a signal swing, for example, between VSS and VDDH. Inverter 244 has an input coupled to node B and provides output signal Dout having a signal swing between negative voltage VEE and positive voltage VDDH.

Figure 2C:
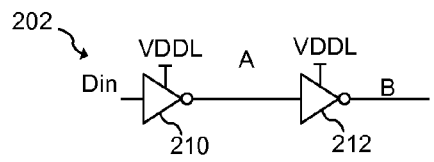

FIG. 2c illustrates low voltage control block 202 according to an embodiment. Here, low voltage control block 202 is implemented using two inverters 210 and 212, the outputs of which are coupled to nodes A and B, respectively, which correspond to nodes A and B in FIG. 2a. As illustrated, inverters 210 and 212 are both referenced to low voltage supply VDDL.

Figure 2D:
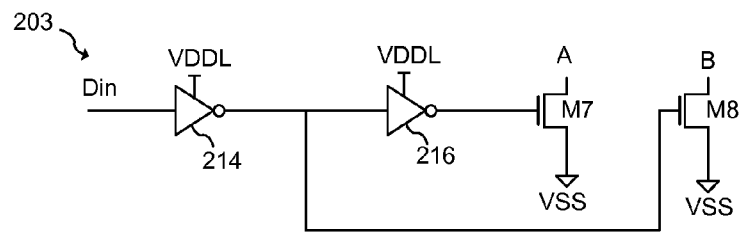

FIG. 2d illustrates low voltage control block 203 according to a further embodiment. Here, the output of inverter 214 is coupled to the gate of NMOS transistor M8, the output of inverter 216 is coupled to the gate of NMOS transistor M7. The drains of NMOS transistors M7 and M8 are coupled to nodes A and B, respectively, which correspond to nodes A and B in FIG. 2a. As illustrated, inverters 210 and 212 both reference to low voltage supply VDDL.

Figure 2E:
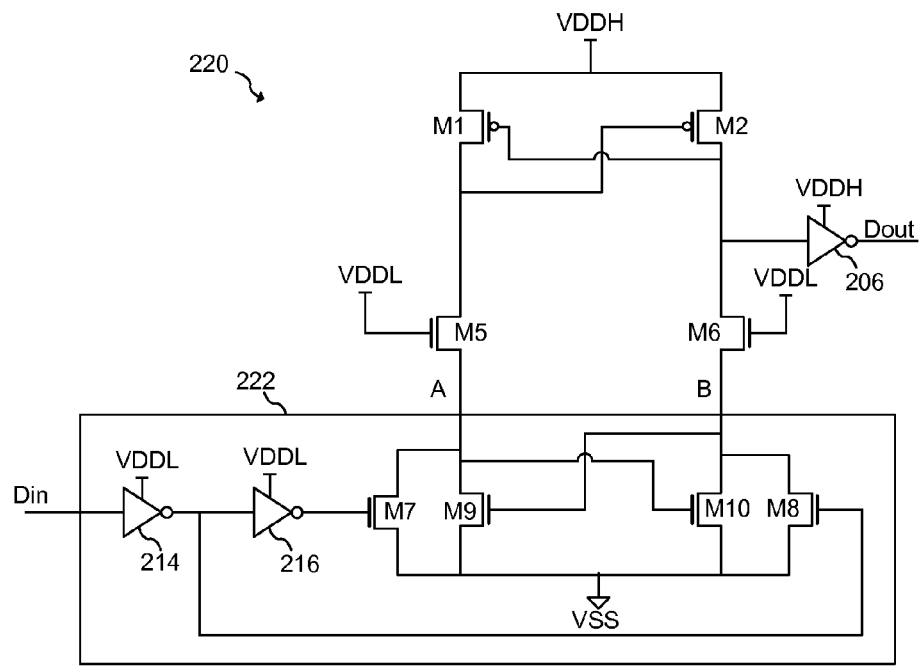

FIG. 2e illustrates embodiment level shifting circuit 220 according to a further embodiment of the present invention. Here level shifting circuit 220 includes low-voltage control block 222 that is similar to low voltage control block 203 in FIG. 2d, with the addition of cross-coupled NMOS devices M9 and M10 that speed up voltage switching at nodes A and B via positive feedback in a manner similar to PMOS devices M1 and M2.

Figure 2F:
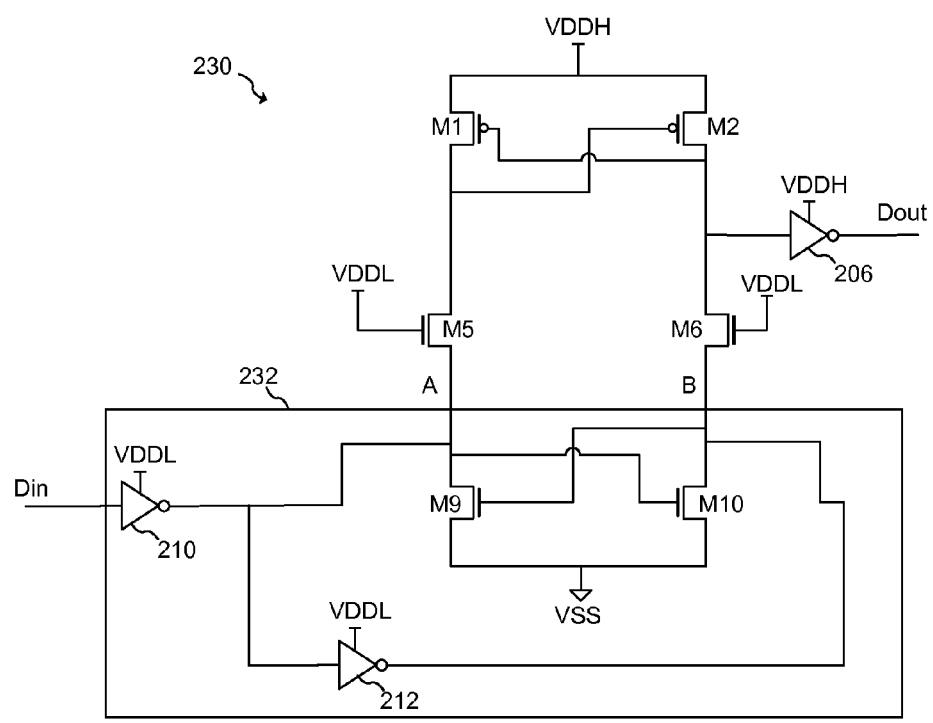

Similarly, FIG. 2f illustrates another embodiment of level shifting circuit 230. Here level shifting circuit 230 includes low-voltage control block 232 that is similar to low voltage control block 202 in FIG. 2b, with the addition of cross-coupled NMOS devices M9 and M10 that speed up voltage switching at nodes A and B via positive feedback in a manner similar to PMOS transistors M1 and M2.

It should be appreciated that the NMOS devices shown in low-voltage control blocks 202, 203, 222, and 232 in FIGS. 2c-f may be implemented using other device types besides NMOS devices. For example, these devices may be implemented using PMOS devices in embodiments where cross-coupled devices M1 and M2 are implemented using NMOS devices. Such a situation may be suitable, for example, for embodiments in which the high voltage supply is referenced to a negative voltage as shown in FIG. 2b.

Figure 3A:
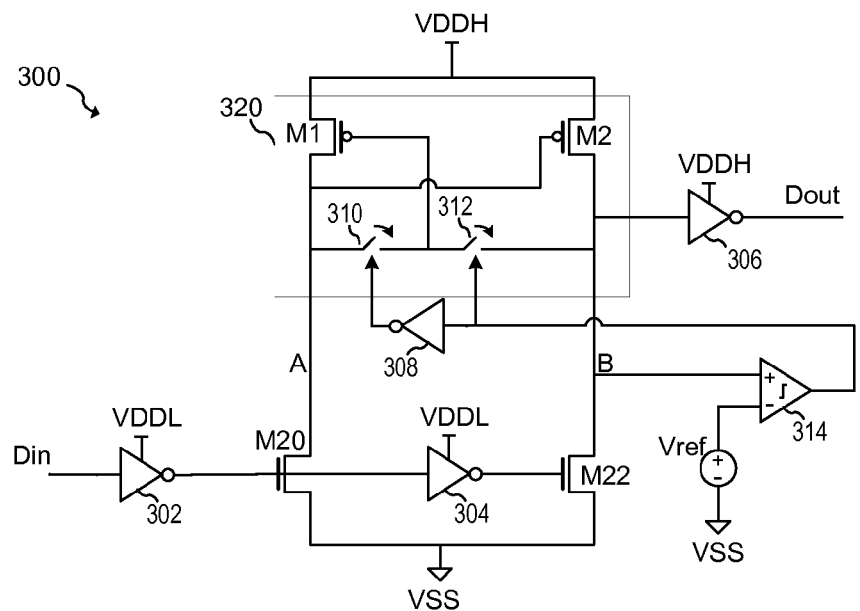
FIGS. 3a-g illustrate level shifters employing embodiment reconfigurable level shifting cores.

In accordance with a further embodiment, level shifter 300 illustrated in FIG. 3a has reconfigurable pull-up circuit 320 that may be used to eliminate contention during certain phases of operation. For example, when node B is at a low voltage, reconfigurable pull-up circuit 320 is configured as a current mirror that mirrors current sourced from NMOS transistor M20 from node A to node B. When the gate of NMOS transistor M20 is driven low to high voltage (power supply voltage VDDL), current is mirrored through PMOS transistor M1 to PMOS transistor M2, thereby driving the voltage of node B to high voltage power supply voltage VDDH. Because transistors M1 and M2 are arranged in a current mirror configuration, there is no contention due to PMOS positive feedback. Once the voltage of node B is high (relative to some threshold voltage), reconfigurable pull-up circuit 320 is configured into a cross-coupled transistor pair to prevent the dissipation of static current. Output signal Dout, which is referenced to power supply voltage VDDH, is produced by inverter 306 having an input coupled to node B.

On the other hand, when node B starts out at a high voltage, M22 is activated and pulls node B low. Even though there is contention due to the cross-coupled differential pair during the initial transition, once the voltage of node B is low (relative to some threshold voltage), reconfigurable pull-up circuit 320 is configured into a current mirror to prevent contention.

Embodiment reconfigurable pull-up circuit 320 is implemented using PMOS transistors M1 and M2 and switches 310 and 312. During a first mode of operation, when the reconfigurable pull-up circuit 320 is configured as a current mirror, switch 310 is closed and switch 312 is open. As such, the gate and drain of PMOS transistor M1 are coupled to the gate of PMOS transistor M2. During the second mode of operation, when reconfigurable pull-up circuit 320 is configured as a cross-coupled transistor pair, switch 310 is opened and switch 312 is closed, thereby coupling the gate of PMOS transistor M1 to the drain of PMOS transistor M2. In the illustrated embodiment, the state of switches 310 and 312 is determined by comparator 314 that compares the voltage of node B with reference voltage Vref. When the voltage of node B is more than reference voltage Vref, the output of comparator 314 is high, thereby activating switch 312, and deactivating switch 310 via inverter 308. Likewise, when the voltage of node B is less than reference voltage Vref, the output comparator is low, thereby deactivating switch 312 and activation switch 310 via inverter 308.

Figure 3B:
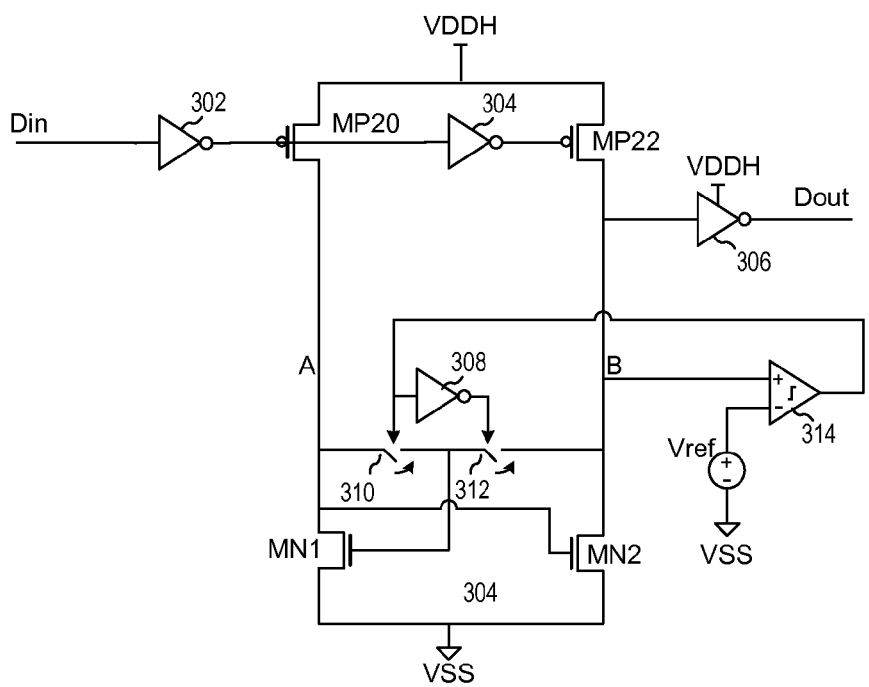

Level shifter 300 further includes input NMOS transistor M20 driven by inverter 302 and input NMOS transistor M22 driven by inverter 304. It should be appreciated that, in alternative embodiments, transistors M1 and M2 may be implemented using NMOS transistors MN1 and MN2, and transistors M20 and M22 may be implemented using PMOS transistors MP20 and MP22 as shown in FIG. 3b.

It should be noted when reconfigurable pull-up circuit 320 of FIG. 3a is in the current mirror configuration, the gate of M1 is not actively driven (M20 being off), but is rather pulled to a higher voltage that is sufficient to turn off M1 since no current can flow via M20. Due to mismatch between M1 and M2 and/or leakage currents within the circuit, a small static current may flow in M2 and M22. To prevent such static current, further embodiment level shifter 390 illustrated in FIG. 3c uses a logic comparator 315 to control the state of switches 310 and 312. As shown, switch 310 is coupled to the output of logic comparator 315. Inverter 309, which is also coupled to the output of logic comparator 315, drives the control input of switch 312. As such, the current mirror configuration is only activated with switch 310 on and switch 312 off, when gate of M20 is logic high and node B is logic low. In some embodiments, this ensures that in all static conditions, transistors M1 and M2 are always configured as a cross-coupled pair with no possibility of static current flow.

Figure 3C:
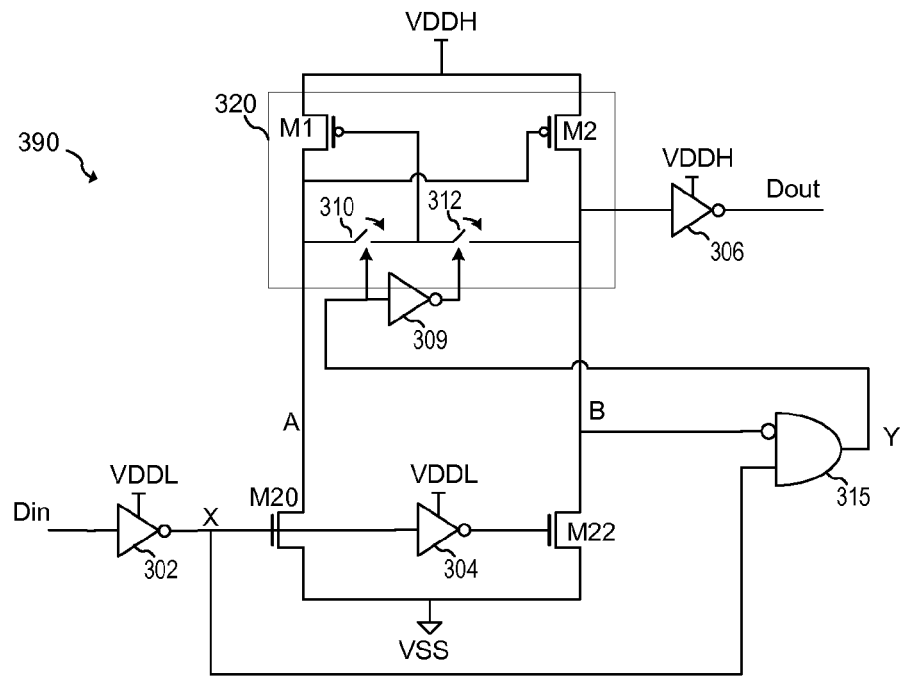
Figure 3D:
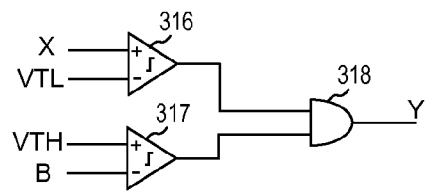
Figure 3E:
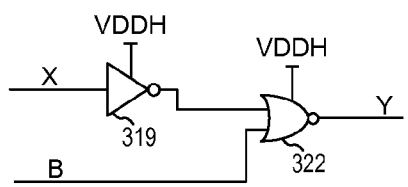

FIGS. 3d and 3e illustrate two possible embodiments of logic comparator 315 shown in FIG. 3c. In FIG. 3d, comparators 316 and 317 are used to check the logic states of X and B relative to logic high (VDDL voltage domain) and logic low (VDDH voltage domain) respectively. The outputs of the comparator are input to logic AND gate 318 that is referenced to the VDDH voltage domain. In FIG. 3e, inverter 319 that is referenced to the VDDH voltage domain is used to check the logic state of X. Similarly, the logic threshold of inverter 319 is set to detect VDDL voltage domain levels by sizing the inverter PMOS and NMOS transistors accordingly. The output of inverter 319 and B are input to NOR gate 322 referenced to VDDH to generate Y. It should be appreciated the circuits illustrated in FIGS. 3d and 3e are two of many possible embodiment implementations of logic comparator 315. In alternative embodiments, other functionally or logically equivalent structures may be used.

Figure 3F:
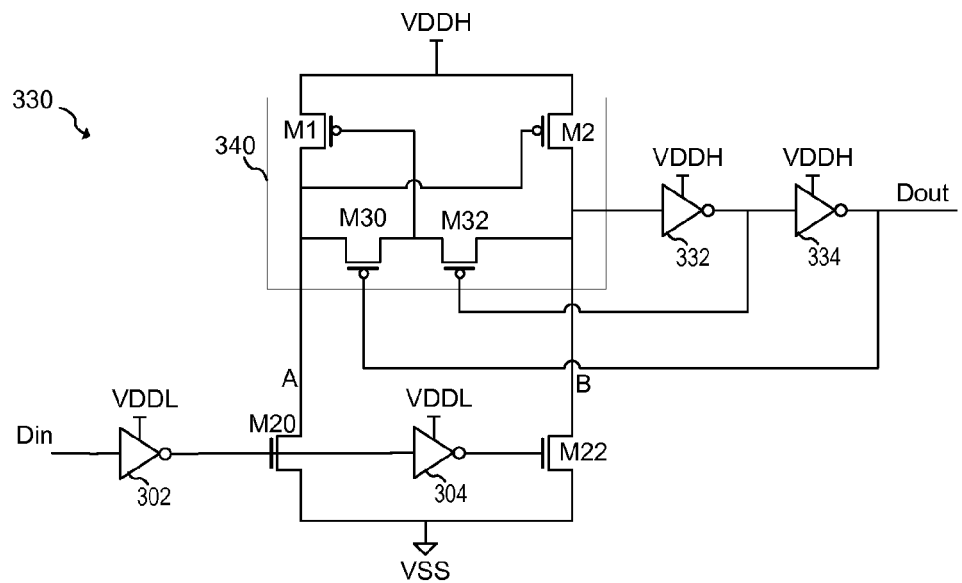

In some embodiments, the function of comparator 314 shown in FIG. 3a may be performed by signal path inverters 332 and 334 within level shifter 330 illustrated in FIG. 3f. Here, the reconfiguration switches are implemented using PMOS transistor M30 coupled to the output of inverter 334, as well as digital output signal Dout, and PMOS transistor M32 coupled to the output of inverter 332. During operation, when node B is low, PMOS transistor M30 is on, and PMOS transistor M32 is off, such that the gate and drain of transistor M1 are coupled to the gate of transistor M2. As such, reconfigurable pull-up circuit 340 is configured as a current mirror. On the other hand, when node B is high, PMOS transistor M30 is off and PMOS transistor M32 is on, such that the gate of transistor M1 is coupled to the drain of transistor M2. As such, transistors M1 and M2 in reconfigurable pull-up circuit 340 are configured as cross-coupled PMOS transistors. Operation proceeds as described with respect to the embodiment of FIG. 3a.

Figure 3G:
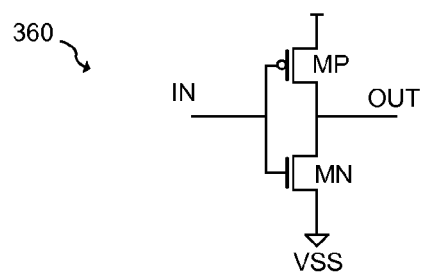

FIG. 3g illustrates a schematic view of CMOS inverter 360 that is implemented using PMOS transistor MP and NMOS transistor MN. In embodiments of the present invention, CMOS inverter circuit 360 may be used to implement the various inverters depicted in embodiments, herein. In some embodiments, inverters coupled to low voltage power supply VDDL may be implemented using low voltage devices, and inverters coupled to high voltage power supply VDDH may be implemented using high voltage devices. Alternatively, all devices may be implemented using low voltage devices or high voltage devices depending on the particular embodiment and its implementation details.

Figure 4:
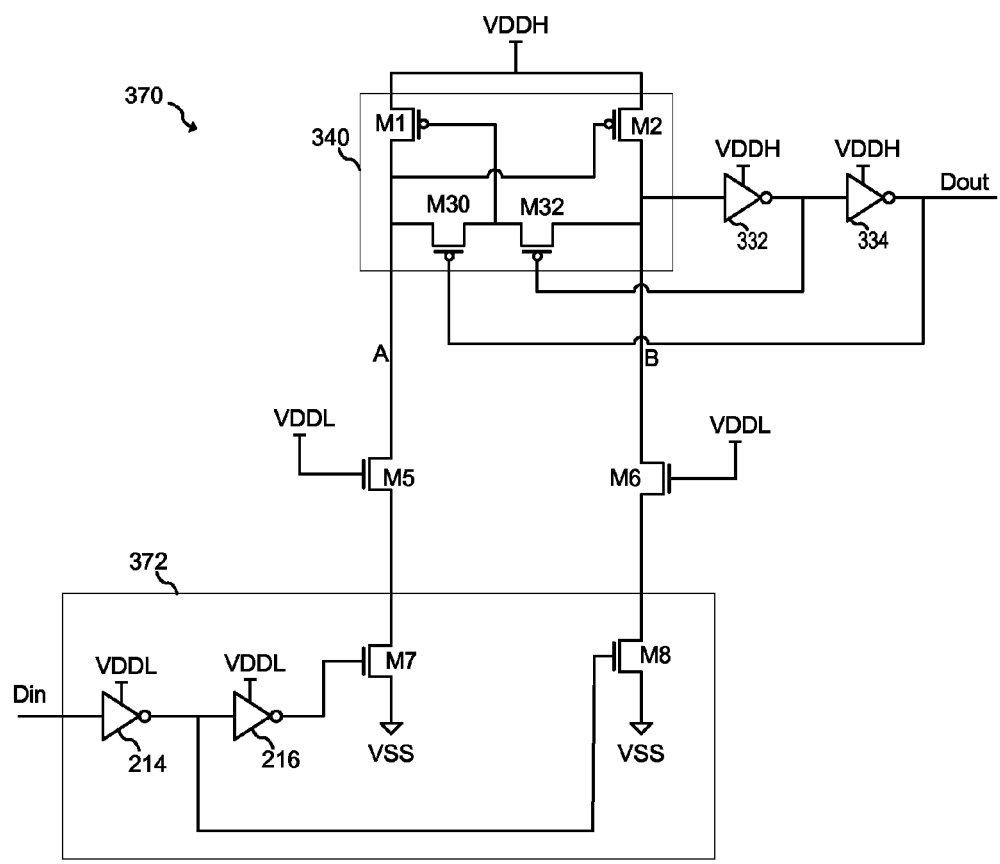
FIG. 4 illustrates a level shifter according to a further embodiment.

FIG. 4 illustrates level shifter 370 according to a further embodiment that includes reconfigurable pull-up circuit 340 as described with respect to FIG. 3f above, common gate stage M5 and M6, and low voltage control block 372 as described in the embodiment of FIG. 2d. Here, contention is reduced using reconfigurable pull-up circuit 340. In addition, drive current during operation is increased by using low voltage devices in low voltage control block 372. Common gate transistors M5 and M6 protect the low voltage devices in low voltage control block 372 from device breakdown and/or damage. In alternative embodiments of the present invention, low voltage control block 372 may also be implemented according to the embodiments shown in FIGS. 2c-f described above.

In accordance with an embodiment, a level shifter circuit includes a reconfigurable level shifting core coupled to a first node and a second node. The reconfigurable level shifting core is configured as a current mirror in a first mode, and as a cross-coupled device in a second mode. In the first mode, the current mirror mirrors a current at the first node to the second node, and in the second mode, the cross-coupled device produces a current at the second node in response to a voltage at the first node, and a current at the first node in response to a voltage at the second node. The first mode may be active when an output voltage is below a threshold, and the second mode may be active when the output voltage is above a threshold.

In an embodiment, the reconfigurable level shifting core includes a first transistor having an output coupled to the first node, a second transistor having an output coupled to the second node, and a switching network coupled to a control node of the first transistor. The first transistor and the second transistor may be implemented using MOS transistors using, for example, PMOS transistors or NMOS transistors.

The switching network may include a first switch coupled between the first node and the control node of the first transistor, and a second switch coupled between the second node and the control node of the first transistor. During operation, the first switch is closed and the second switch is open in the first mode, and the first switch is open and the second switch is closed in the second mode. The circuit may further include a comparator having an output coupled to the first switch and to the second switch, and a logic block. In an embodiment, the comparator may include a first comparison circuit coupled to an input of the level shifting circuit, and a second comparison circuit coupled to the second node. The first comparison circuit is configured to compare the input of the level shifting circuit with a first logic threshold reference to a first power supply domain, and the second comparison circuit configured to compare the second node with a second logic threshold referenced to a second power supply domain. The logic block is configured to activate the first switch and deactivate the second switch only when the input of the level shifting circuit has a voltage that is greater than the first logic threshold, and the second node has a voltage that is less than the second logic threshold.

In an embodiment, the circuit may include a logic circuit coupled to the first switch and the second switch. The logic circuit may be configured to activate the first switch and deactivate the second switch only when an input of the level shifting circuit has a voltage that is greater than a first logic threshold, and the second node has a voltage that is less than a second logic threshold.

In some embodiments, the circuit includes an input stage coupled to first and second nodes, and an output stage coupled to the second node. The input stage includes a third transistor having an output node coupled to the first node, and a fourth transistor having an output node coupled to the second node, and the output stage comprises an inverter having an input coupled to the second node.

In some embodiments, the first mode is active only when an output voltage of the level shifter circuit is below a first threshold and an input voltage of the level shifter circuit is below a second threshold; and the second mode is active when the first mode is not active.

In an embodiment, the circuit further includes a first pass transistor coupled between the first node and a first internal node, a second pass transistor coupled between the second node and a second internal node, and a low voltage control stage having a first output coupled to the first internal node, a second output coupled to the second internal node, and a logic input node.

In accordance with another embodiment, a level shifting circuit includes a first transistor having a drain coupled to a first node, a second transistor having a drain coupled to a second node and a gate coupled to the first node, a first switch coupled between the first node and a gate of the first transistor, a second switch coupled between the gate of the first transistor and the second node, and an output stage coupled to the second node, to a control node of the first switch, and to a control node of the second switch. In some embodiment, the level shifting circuit also includes an input stage having a first input transistor coupled to the first node, and a second input transistor coupled to the second node. The first and second input transistors may be implemented using NMOS devices, PMOS devices or other device types.

In some embodiments, the output stage of the level shifter has a first inverter including an input coupled to the second node, and an output coupled to the control node of the second switch, and a second inverter including an input coupled to an output of the first inverter, and an output coupled to the control node of the first switch.

Figure 5:
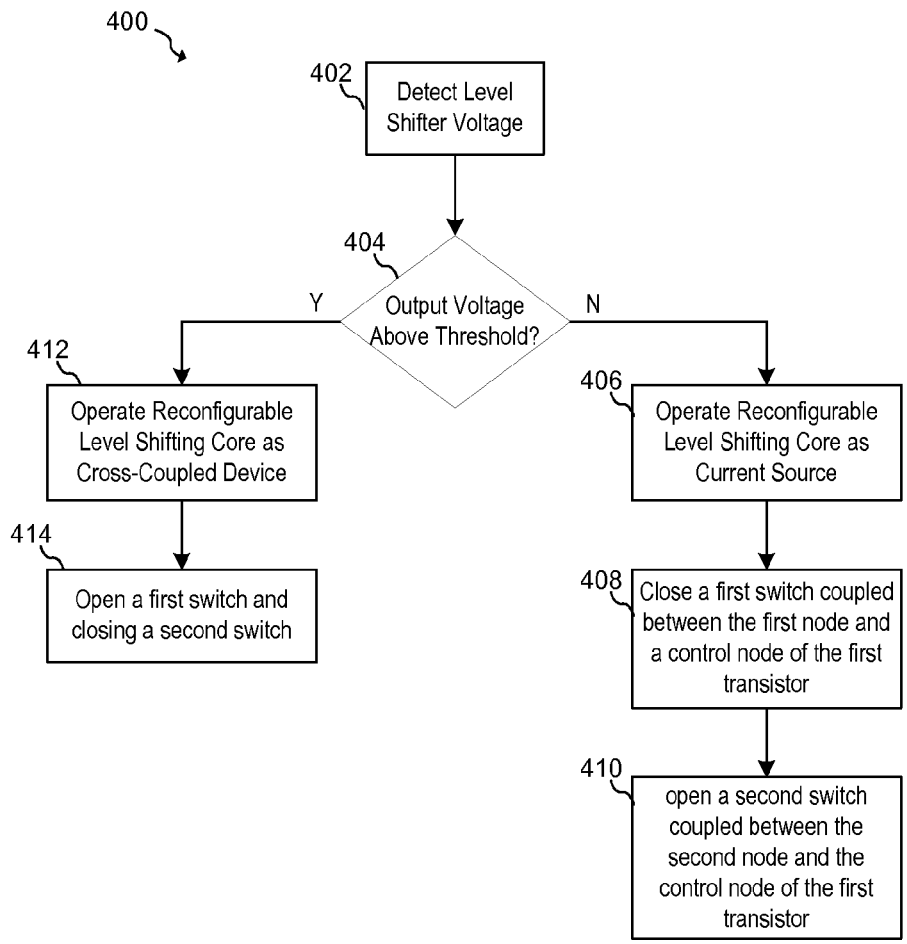
FIG. 5 illustrates a flowchart of an embodiment method.

FIG. 5 illustrates a flowchart of method 400 of operating an embodiment level shifter. Method 400 includes detecting a voltage of the level shifter in step 402. The method includes operating a reconfigurable level shifting core of the level shifter as a current source when an output voltage is in a first region (step 406), and operating the reconfigurable level shifting core of the level shifter as a cross-coupled device when the output voltage is in a second region (step 412). In one example, the first region is below a voltage threshold, and the second region is above a voltage threshold (step 404).

The method may further include providing a first input current to a first transistor of the reconfigurable level shifting core of the level shifter at a first node, and providing a first input current to a second transistor of the reconfigurable level shifting core of the level shifter at a second node. Operating the reconfigurable level shifting core of the level shifter as a current source may include closing a first switch coupled between the first node and a control node of the first transistor (step 408), and opening a second switch coupled between the second node and the control node of the first transistor (step 410). On the other hand, operating the reconfigurable level shifting core of the level shifter as a cross-coupled device may include opening the first switch and closing the second switch (step 412).

In accordance with a further embodiment, a level shifter includes a cross-coupled transistor pair having a first internal node coupled to an output node of a first transistor and a control node of a second transistor, and a second internal node coupled to an output node of the second transistor and a control node of the first transistor. The level shifter further includes a first pass transistor coupled between a first input node and the first internal node, a second pass transistor coupled between a second input node and the second internal node, and a low voltage control stage having a first output coupled to the first input node, and a second output coupled to the second input node. The first and second pass transistor may be implemented using high-voltage devices, or other device types. Moreover, the level shifter may also include a further cross-coupled transistor pair coupled to the first input node and the second input node.

In an embodiment, the low voltage control stage includes a first inverter having an output coupled to the first input node, and a second inverter having an output coupled to the second input node. The level shifter may further include a first input transistor having an output node coupled to the first input node, a second input transistor having an output node coupled to the second input node, a first inverter having an output coupled to a control node of the second input transistor, and a second inverter having an input coupled to the output of the first inverter, and an output coupled to a control node of the first input transistor.

Advantages of embodiments include the ability to increase drive strength, decrease propagation delay, and reduce contention in a level shifter. In some embodiments, increased performance may be achieved without an appreciable increase in power consumption and device area.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A level shifter circuit comprising:
a reconfigurable level shifting core coupled to a first node and a second node, wherein
the reconfigurable level shifting core is configured as a current mirror in a first mode, the current mirror mirroring a current at the first node to the second node, and
the reconfigurable level shifting core is configured as a cross-coupled device in a second mode, the cross-coupled device producing a current at the second node in response to a voltage at the first node, and producing a current at the first node in response to a voltage at the second node, wherein the first mode is active only when an output voltage of the level shifter circuit is below a first threshold and an input voltage of the level shifter circuit is below a second threshold; and the second mode is active when the first mode is not active.

2. The circuit of claim 1, wherein the reconfigurable level shifting core comprises:
a first transistor having an output coupled to the first node;
a second transistor having an output coupled to the second node; and
a switching network coupled to a control node of the first transistor.

3. The circuit of claim 2, wherein the first transistor and the second transistor are MOS transistors.

4. The circuit of claim 3, wherein the MOS transistors are PMOS transistors.

5. The circuit of claim 3, wherein the MOS transistors are NMOS transistors.

6. The circuit of claim 2, wherein the switching network comprises:
a first switch coupled between the first node and the control node of the first transistor; and
a second switch coupled between the second node and the control node of the first transistor, wherein the first switch is closed and the second switch is open in the first mode, and the first switch is open and the second switch is closed in the second mode.

7. The circuit of claim 6, further comprising a comparator having an output coupled to the first switch and to the second switch, the comparator comprising:
a first comparison circuit coupled to an input of the level shifter circuit, the first comparison circuit configured to compare the input of the level shifter circuit with a first logic threshold reference to a first power supply domain;
a second comparison circuit coupled to the second node, the second comparison circuit configured to compare the second node with a second logic threshold referenced to a second power supply domain; and
a logic block configured to activate the first switch and deactivate the second switch only when the input of the level shifter circuit has a voltage that is greater than the first logic threshold, and the second node has a voltage that is less than the second logic threshold.

8. The circuit of claim 1, further comprising:
an input stage coupled to the first and second nodes; and
an output stage coupled to the second node.

9. The circuit of claim 8, wherein:
the input stage comprises a third transistor having an output node coupled to the first node, and a fourth transistor having an output node coupled to the second node; and
the output stage comprises an inverter having an input coupled to the second node.

10. The circuit of claim 1, further comprising:
a first pass transistor coupled between the first node and a first internal node;
a second pass transistor coupled between the second node and a second internal node; and
a low voltage control stage having a first output coupled to the first internal node, a second output coupled to the second internal node, and a logic input node.

11. The circuit of claim 10, wherein the first and second pass transistor comprise high-voltage devices.

12. The circuit of claim 10, further comprising a cross-coupled transistor pair coupled to the first internal node and to the second internal node.

13. The circuit of claim 10, wherein the low voltage control stage comprises a first inverter having an output coupled to the first internal node, and a second inverter having an output coupled to the second internal node.

14. The circuit of claim 10, wherein the low voltage control stage comprises:
a first input transistor having an output node coupled to the first internal node;
a second input transistor having an output node coupled to the second internal node;
a first inverter having an output coupled to a control node of the second input transistor; and
a second inverter having an input coupled to the output of the first inverter, and an output coupled to a control node of the first input transistor.

15. A level shifter circuit comprising:
a reconfigurable level shifting core coupled to a first node and a second node, wherein
the reconfigurable level shifting core is configured as a current mirror in a first mode, the current mirror mirroring a current at the first node to the second node,
the reconfigurable level shifting core is configured as a cross-coupled device in a second mode, the cross-coupled device producing a current at the second node in response to a voltage at the first node, and producing a current at the first node in response to a voltage at the second node, and the reconfigurable level shifting core comprises:
  a first transistor having an output coupled to the first node;
  a second transistor having an output coupled to the second node; and
  a switching network coupled to a control node of the first transistor, wherein the switching network comprises: a first switch coupled between the first node and the control node of the first transistor; and a second switch coupled between the second node and the control node of the first transistor, wherein the first switch is closed and the second switch is open in the first mode, and the first switch is open and the second switch is closed in the second mode; and
a logic circuit coupled to the first switch and the second switch, the logic circuit configured to activate the first switch and deactivate the second switch only when an input of the level shifting circuit has a voltage that is greater than a first logic threshold, and the second node has a voltage that is less than a second logic threshold.

16. A level shifting circuit comprising:
a first transistor having a drain coupled to a first node;
a second transistor having a drain coupled to a second node and a gate coupled to the first node;
a first switch coupled between the first node and a gate of the first transistor;
a second switch coupled between the gate of the first transistor and the second node; and
an output stage coupled to the second node, to a control node of the first switch, and to a control node of the second switch, wherein the output stage comprises:
  a first inverter having an input coupled to the second node, and an output coupled to the control node of the second switch; and
  a second inverter having an input coupled to an output of the first inverter, and an output coupled to the control node of the first switch.

17. The level shifting circuit of claim 16, further comprising an input stage comprising:
a first input transistor coupled to the first node; and
a second input transistor coupled to the second node.

18. The level shifting circuit of claim 17, wherein:
the first input transistor comprises an NMOS device; and
the second input transistor comprises an NMOS device.

19. The level shifting circuit of claim 16, wherein:
the first transistor comprises a PMOS device; and
the second transistor comprises a PMOS device.

20. A method of operating a level shifter, the method comprising:
detecting a voltage of the level shifter;
operating a reconfigurable level shifting core of the level shifter as a current mirror only when an output voltage of the level shifter is below a first threshold and an input voltage of the level shifter is below a second threshold; and
operating the reconfigurable level shifting core of the level shifter as a cross-coupled device when the reconfigurable level shifting core is not operated as a current mirror.

21. The method of claim 20, further comprising:
providing a first input current to a first transistor of the reconfigurable level shifting core of the level shifter at a first node; and
providing a second input current to a second transistor of the reconfigurable level shifting core of the level shifter at a second node.

22. The method of claim 21, wherein:
operating the reconfigurable level shifting core of the level shifter as a current mirror comprises closing a first switch coupled between the first node and a control node of the first transistor, and opening a second switch coupled between the second node and the control node of the first transistor; and
operating the reconfigurable level shifting core of the level shifter as a cross-coupled device comprises opening the first switch and closing the second switch.

* * * * *